(12) United States Patent
Smith et al.

(10) Patent No.: US 8,035,189 B2
(45) Date of Patent: *Oct. 11, 2011

(54) SEMICONDUCTOR CONSTRUCTIONS

(75) Inventors: Michael A. Smith, Boise, ID (US);
Sukesh Sandhu, Boise, ID (US);
Xianfeng Zhou, Meridian, ID (US);
Graham Wolstenholme, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/837,378

(22) Filed: Jul. 15, 2010

(65) Prior Publication Data
US 2010/0276781 A1 Nov. 4, 2010

Related U.S. Application Data

(60) Continuation of application No. 12/276,235, filed on Nov. 21, 2008, now Pat. No. 7,781,860, which is a division of application No. 11/197,882, filed on Aug. 5, 2005, now Pat. No. 7,473,615.

(51) Int. Cl.
*H01L 29/00* (2006.01)
(52) U.S. Cl. ........ 257/506; 257/499; 257/510; 257/513; 257/288; 257/368
(58) Field of Classification Search ................ 257/506, 257/499, 510, 513, 288, 368
See application file for complete search history.

(56) References Cited

U.S. PATENT DOCUMENTS

| 6,027,982 | A | 2/2000 | Peidous et al. |
| 7,781,860 | B2 * | 8/2010 | Smith et al. ................... 257/506 |
| 2002/0197823 | A1 | 12/2002 | Yoo et al. |
| 2005/0136588 | A1 | 6/2005 | Speyer |

OTHER PUBLICATIONS

Balasubramanian, N. et al., "Active Corner Engineering in the Process Integration for Shallow Trench Isolation", J. Vac.Sci.Technol. B 18(2), Mar./Apr. 2000, pp. 700-705.

Tung, C. et al, ULSI Semiconductor Technology Atlas, Wiley-Interscience 2003, Chap. 6.5 "Shallow Trench Isolation (STI)" pp. 235-249.

* cited by examiner

*Primary Examiner* — Long Pham
(74) *Attorney, Agent, or Firm* — Wells St. John P.S.

(57) ABSTRACT

The invention includes methods of forming oxide structures under corners of transistor gate stacks and adjacent trenched isolation regions. Such methods can include exposure of a semiconductor material to steam and $H_2$, with the $H_2$ being present to a concentration of from about 2% to about 40%, by volume. An oxide structure formed under the bottom corner of a transistor gate stack can have a bottom surface with a topography that includes a step of at least about 50 Å, and an upper surface directly over the bottom surface and having a topography that is substantially planar. Methodology of the present invention can be utilized to form semiconductor constructions suitable for incorporation into highly integrated circuitry. The highly integrated circuitry can be incorporated into electronic systems, and can, for example, be utilized in processors and/or memory storage devices.

9 Claims, 9 Drawing Sheets

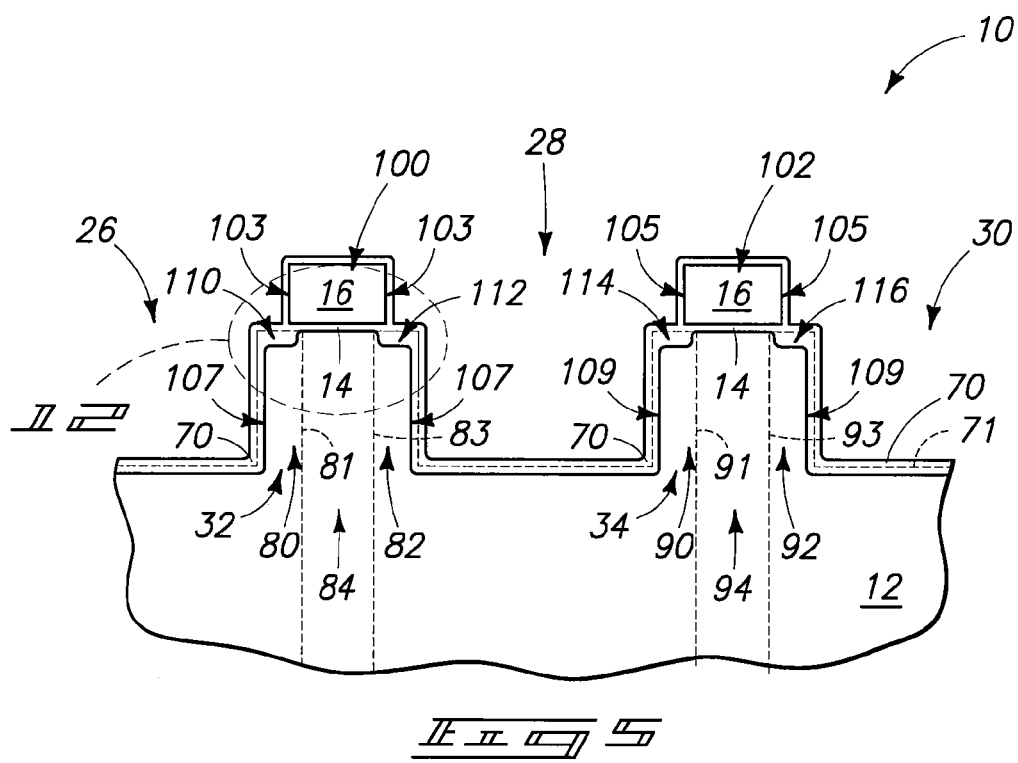
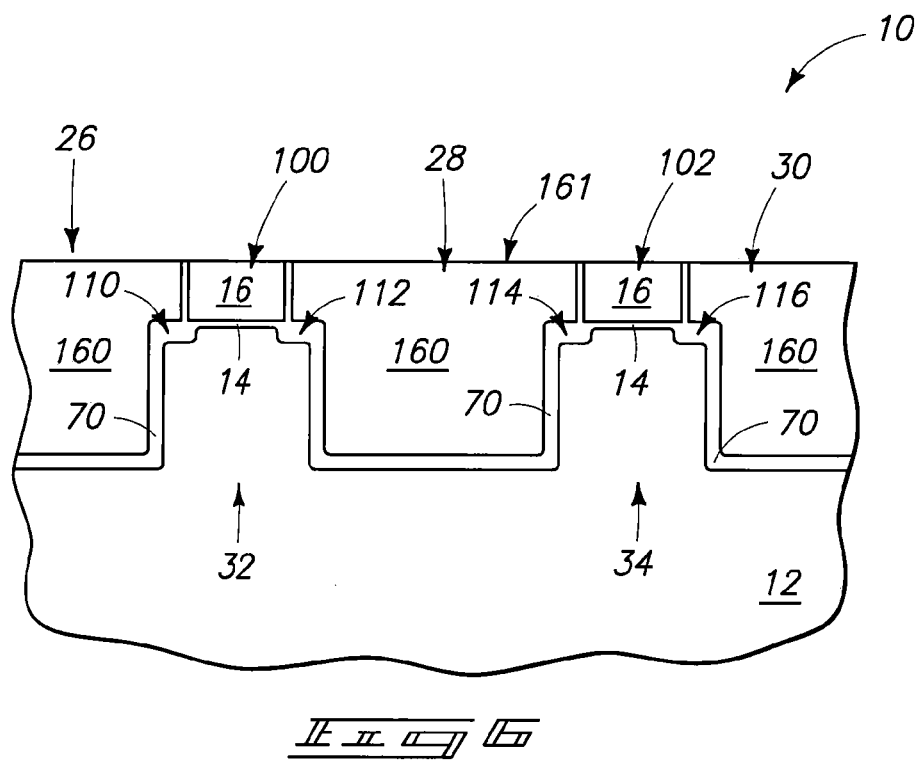

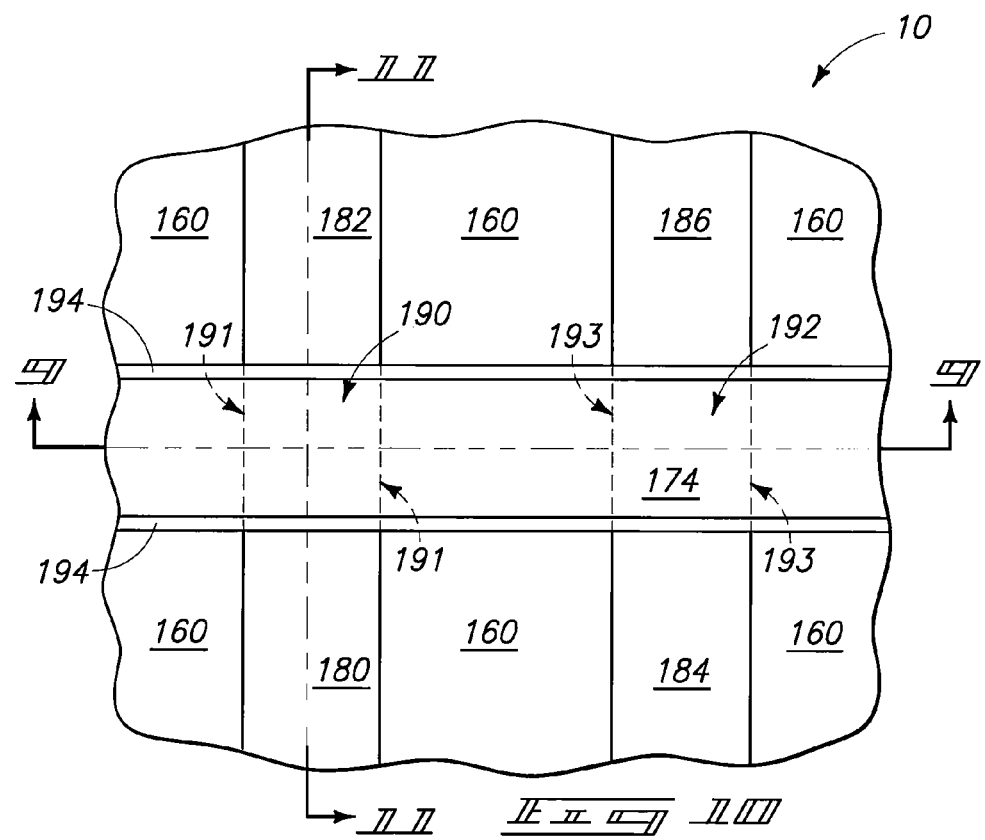
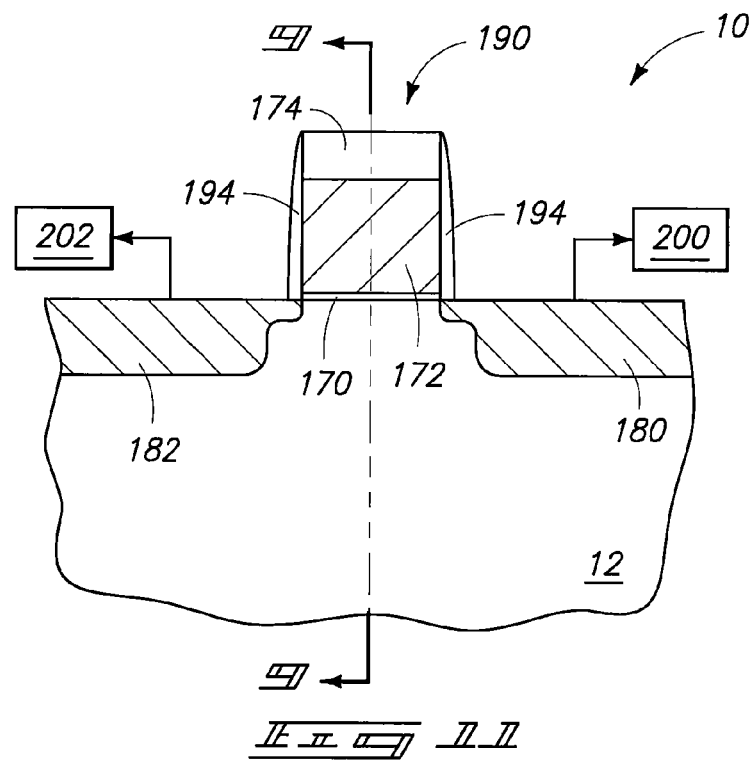

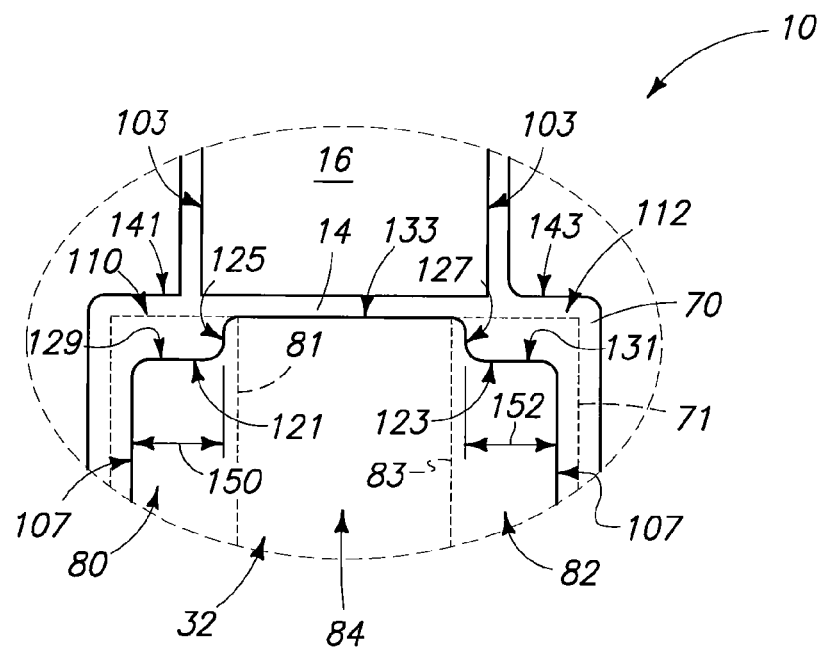
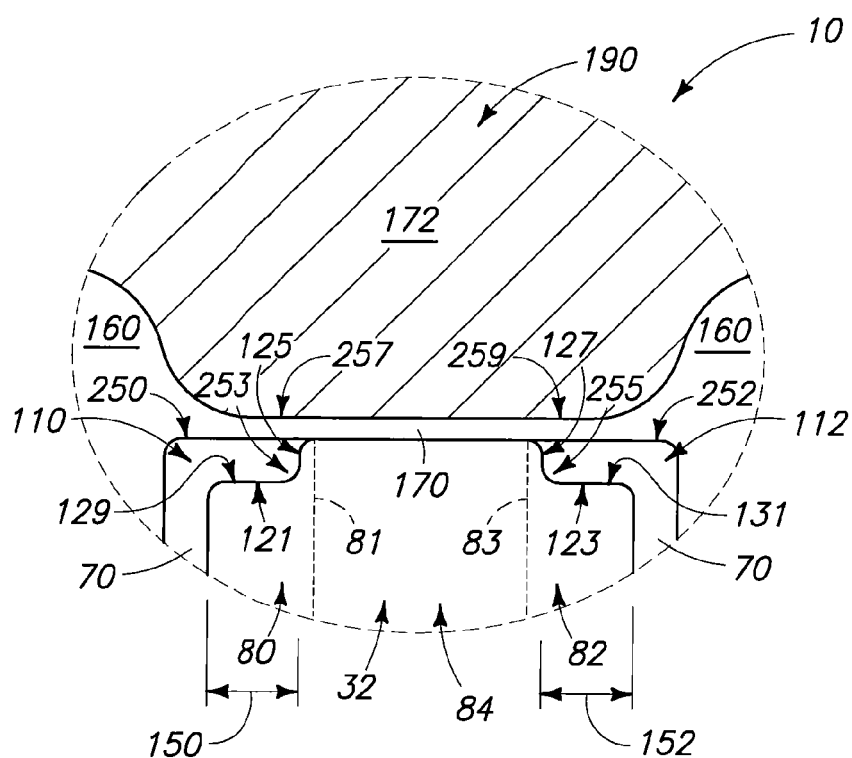

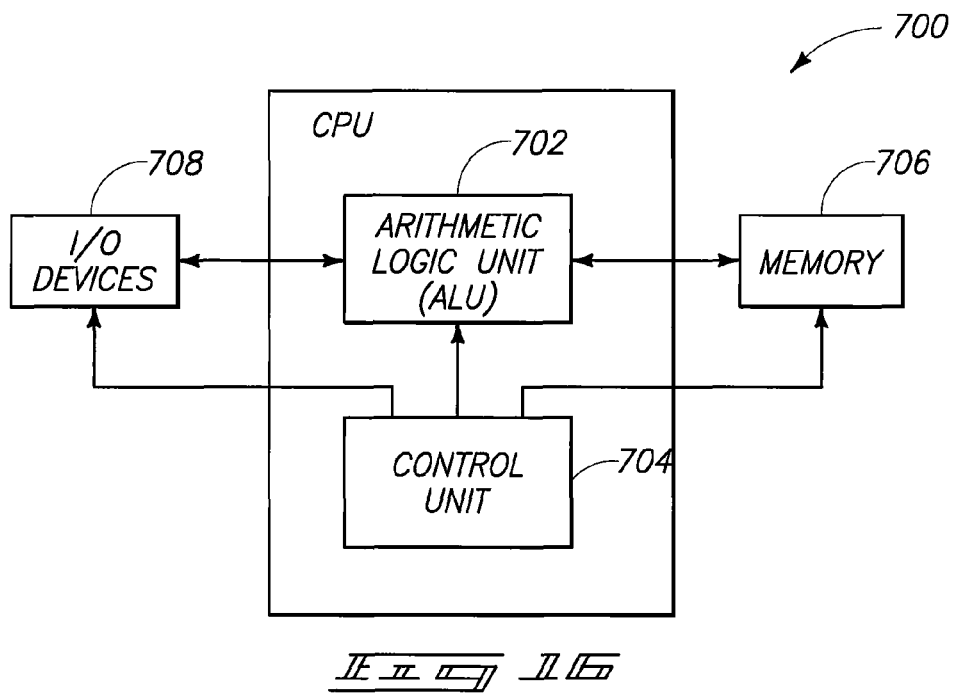
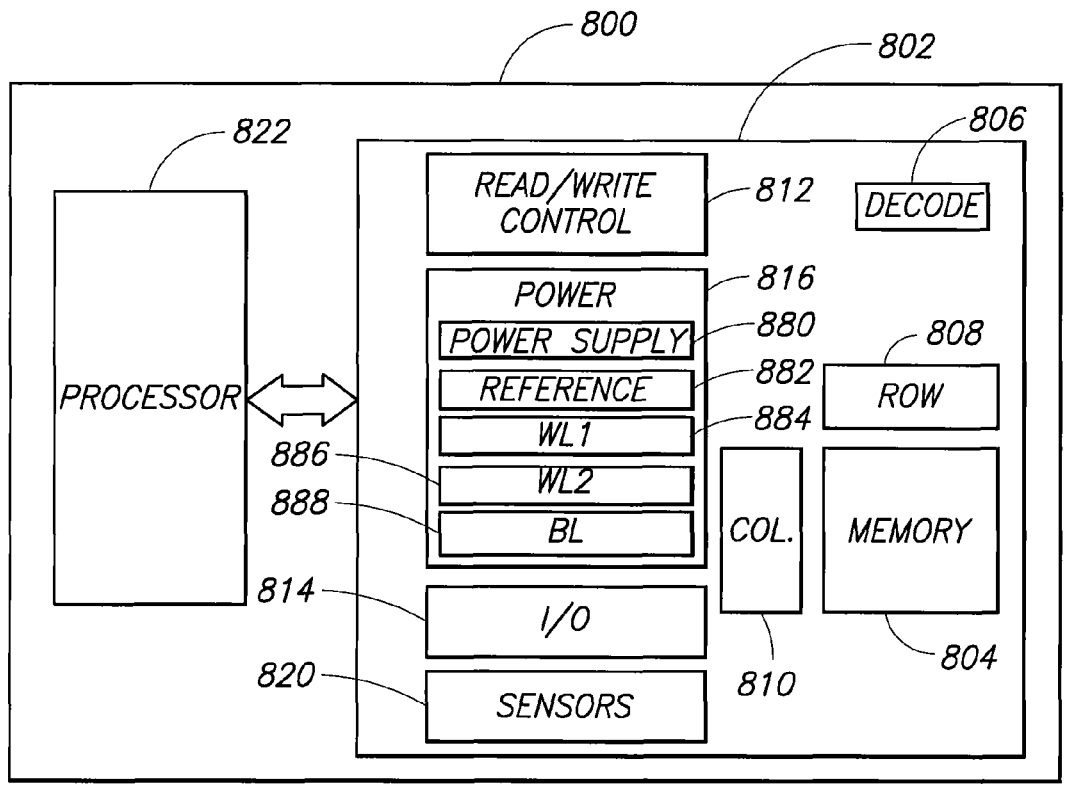

SEMICONDUCTOR CONSTRUCTIONS

RELATED PATENT DATA

This patent resulted from a continuation of U.S. patent application Ser. No. 12/276,235, which was filed Nov. 21, 2008, which issued Aug. 24, 2010 as U.S. Pat. No. 7,781,860, which is hereby incorporated herein by reference; which resulted from a divisional of U.S. patent application Ser. No. 11/197,882, which was filed Aug. 5, 2005, which issued as U.S. Pat. No. 7,473,615, and which is hereby incorporated herein by reference.

TECHNICAL FIELD

The invention pertains to semiconductor processing methods, semiconductor constructions, and electronic systems.

BACKGROUND OF THE INVENTION

Trenched isolation regions are commonly utilized for electrically isolating adjacent structures in highly integrated semiconductor constructions. A common form of trenched isolation region is a so-called shallow trench isolation (STI) region.

The trenched isolation regions can be utilized, for example, for providing isolation between adjacent transistor structures. A difficulty which can occur when utilizing a trenched isolation region adjacent a transistor structure is that a sharp active corner at the trenched isolation region edge can lead to a high fringing electric field, which can establish a parasitic transistor with a lower threshold voltage ($V_t$) along the trench edge in parallel to the normal transistor. An edge transistor with a lower $V_t$ provides a leakage path even before the normal transistor is turned "on." This can lead to numerous problems during operation of the transistor, and can manifest as a "double hump" in the sub-threshold characteristics of the transistor.

Another problem that can occur with field oxide is thinning of the field oxide at corners under transistor gates. The thinning can occur due to thermal oxide tending to not grow as thick on the corners as in the central region of the field oxide. The thinning of the field oxide at the corners can exacerbate the fringing electric field problems discussed above, and can lead to decreased reliability of the oxide.

Numerous approaches have been developed for attempting to alleviate problems associated with sharp active corners at trenched isolation region edges, but such approaches have not yet proven to be fully satisfactory. Accordingly, it would be desirable to develop new methodologies for alleviating problems associated with sharp active corners at trenched isolation region edges.

SUMMARY OF THE INVENTION

In one aspect, the invention includes a semiconductor processing method. A semiconductor substrate is provided to have a patterned mask thereover. A trench is formed in the substrate proximate the mask. After the trench is formed, the mask is laterally recessed. The substrate is oxidized utilizing an oxidant in the presence of hydrogen to form an oxide structure between the trench and the laterally-recessed mask. Insulative material is deposited within the trench and over the oxide structure. While at least some of the oxide structure remains, at least a portion of the mask is replaced with at least a portion of a transistor gate stack.

In one aspect, the invention encompasses a semiconductor processing method in which a construction is provided which has upwardly-extending mesas of semiconductor material, and has nitride-containing structures on the mesas. The nitride-containing structures are laterally recessed. The semiconductor material is oxidized utilizing an oxidant in the presence of hydrogen to form oxide structures on the mesas beside the laterally-recessed nitride-containing structures. Insulative material is deposited over the oxide structures. While at least portions of the oxide structures are on the mesas, at least portions of the nitride-containing structures are replaced with at least portions of transistor gate stacks.

In one aspect, the invention includes a semiconductor construction. The construction includes a semiconductor substrate having trenches extending into a semiconductor material, and having regions of the semiconductor material between the trenches. Individual regions of the semiconductor material have opposing pairs of lateral edge portions along the trenches, and have central portions between the opposing pairs of lateral edge portions. An electrically conductive line extends across two or more of the regions of the semiconductor material. A dielectric material is between the electrically conductive line and the regions of the semiconductor material. At least some of the dielectric material includes oxide over the lateral edge portions of the regions, with the oxide having a bottom surface with a topography that includes a step of at least about 50 Å, and having an upper surface directly over the bottom surface with a topography that is substantially planar.

In one aspect, the invention includes an electronic system. The system comprises a processor, and a memory storage device in data communication with the processor. At least one of the memory storage device and the processor comprises a semiconductor substrate having trenches extending into a semiconductor material, and having regions of the semiconductor material between the trenches. Individual regions of the semiconductor material have opposing pairs of lateral edge portions along the trenches and have central portions between the opposing pairs of lateral edge portions. Transistors are associated with at least some of the regions of the semiconductor material. At least some of the transistors have electrically conductive transistor gates over the regions of the semiconductor material. The transistors also have gate dielectric between the transistor gates and the regions of the semiconductor material. At least some of the gate dielectric includes oxide over the lateral edge portions of the regions. The oxide has a bottom surface with a topography that includes a step of at least about 50 Å, and has an upper surface directly over the bottom surface and with a topography that is substantially planar.

BRIEF DESCRIPTION OF THE DRAWINGS

Preferred embodiments of the invention are described below with reference to the following accompanying drawings.

FIG. 5 is a view of the FIG. 1 fragment shown at a processing stage subsequent to that of FIG. 4.

FIG. 6 is a view of the FIG. 1 fragment shown at a processing stage subsequent to that of FIG. 5.

FIG. 10 is a top view of a portion of a semiconductor wafer comprising the fragment of FIG. 9 along the line 9-9.

FIG. 11 is a view along the lines 11-11 of FIGS. 9 and 10, and shows an exemplary transistor device that can be formed along a segment of the constructions of FIGS. 9 and 10. The fragment of FIG. 9 is along the line 9-9 of FIG. 11.

FIG. 12 is an expanded view of a region labeled "12" in FIG. 5.

FIG. 13 is an expanded view of a region labeled "13" in FIG. 9.

FIG. 16 is a high-level block diagram of an electronic system according to an exemplary aspect of the present invention.

FIG. 17 is a simplified block diagram of an exemplary memory device according to an aspect of the present invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In some aspects, the invention includes methods of forming a desirable profile at a field edge active area. In particular aspects, such profile is created by recessing a nitride-containing masking material to expose an underlying silicon-containing material, and subsequently oxidizing the silicon-containing material with steam having $H_2$ present therein to a concentration of from about 2% to about 40%, by volume. The desired profile can be within an oxide structure formed under the bottom corner of a transistor gate stack. Such oxide structure can have a bottom surface with a topography that includes a step of at least about 50 Å, and can have an upper surface directly over the bottom surface and with a topography that is substantially planar.

An exemplary aspect of the invention is described with reference to FIGS. 1-13.

Figure 1:
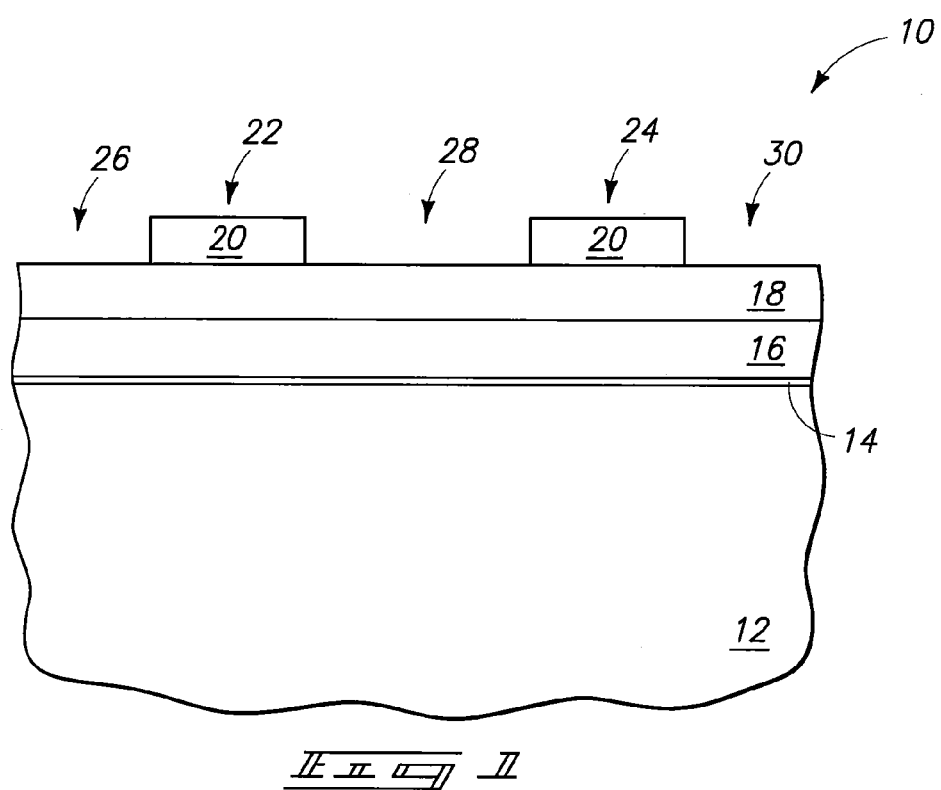
FIG. 1 is a diagrammatic, cross-sectional view of a semiconductor wafer fragment at a preliminary processing stage of an exemplary aspect of the present invention.

Referring to FIG. 1, a fragment 10 of a semiconductor wafer construction is illustrated at a preliminary processing stage. Fragment 10 comprises a semiconductor substrate 12. Such substrate can comprise any semiconductor material or combination of semiconductor materials. In particular aspects, the substrate will comprise, consist essentially of, or consist of monocrystalline silicon of a bulk silicon wafer. Such monocrystalline silicon can be lightly background doped with p-type dopant. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

An oxide-containing layer 14 is over substrate 12. The oxide-containing layer can, for example, comprise, consist essentially of, or consist of silicon dioxide.

A nitride-containing layer 16 is over oxide-containing layer 14. Nitride-containing layer 16 can, for example, comprise, consist essentially of, or consist of silicon nitride.

An oxide-containing layer 18 is over nitride-containing layer 16. In particular aspects, oxide-containing layer 14 can be referred to as a first oxide-containing layer and oxide-containing layer 18 can be referred to as a second oxide-containing layer. The oxide-containing layer 18 can comprise, consist essentially of, or consist of silicon dioxide, and can be formed by, for example, chemical vapor deposition utilizing tetraethylorthosilicate (TEOS).

Patterned photoresist 20 is over oxide-containing layer 18. Photoresist 20 can be patterned by, for example, photolithographic processing. In the shown cross-sectional view, the patterned photoresist forms a pair of segments 22 and 24, and defines openings 26, 28 and 30 adjacent the segments.

Figure 2:
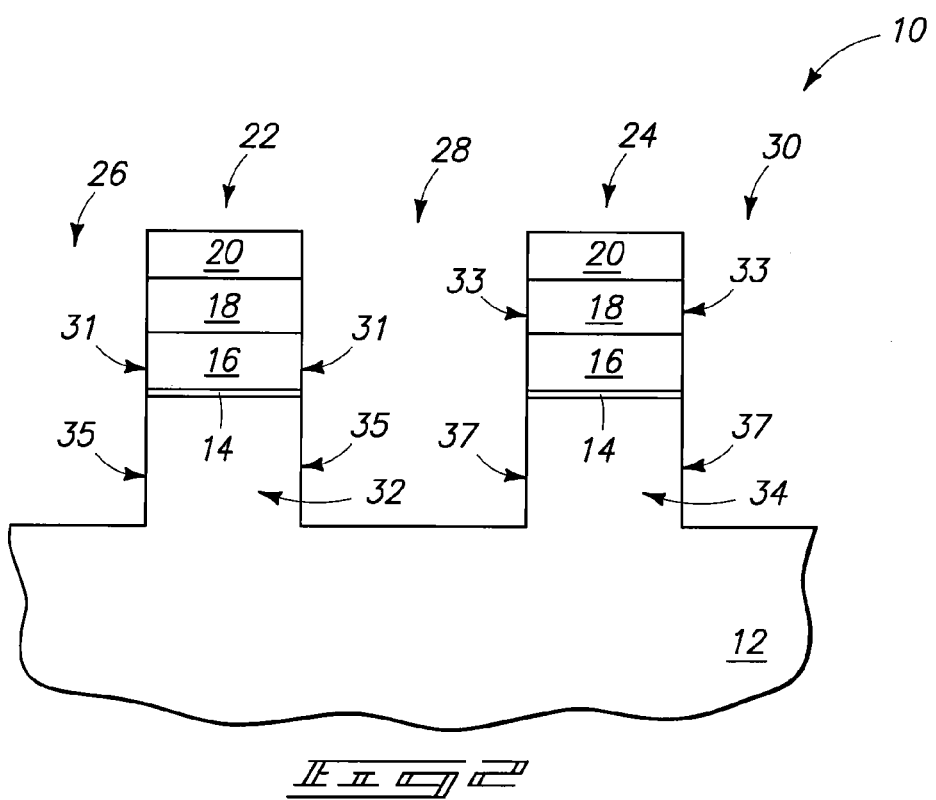
FIG. 2 is a view of the FIG. 1 fragment shown at a processing stage subsequent to that of FIG. 1.

Referring to FIG. 2, a pattern is transferred from the patterned photoresist 20 through the layers 14, 16 and 18, and into substrate 12. Thus, openings 26, 28 and 30 are extended through layers 14, 16 and 18, and into the substrate 12. Such extension of the openings can be accomplished with any suitable etch, or combination of etches.

The openings 26, 28 and 30 of FIG. 2 can, in particular aspects, correspond to trenches extending longitudinally into and out of the page relative to the cross-sectional view of FIG. 2.

The substrate 12 can be considered to comprise upwardly-extending portions 32 and 34 beneath the segments 22 and 24 of the patterned resist 20. Such upwardly-extending portions of the substrate can alternatively be referred to as upwardly-extending mesas of the substrate provided between openings 26, 28 and 30.

Although the patterned photoresist 20 is shown remaining over substrate 12 after extension of openings 26, 28 and 30 into the substrate, it is to be understood that the invention also encompasses aspects in which a pattern from resist 20 is transferred to one or more of the underlying layers 14, 16 and 18, and then resist 20 is removed and the patterned underlying layers are utilized as a hard mask during subsequent etching to extend the openings 26, 28 and 30 beyond the patterned layers. Regardless of whether any of the layers 14, 16, 18 and 20 is removed prior to extending the openings 26, 28 and 30 into substrate 12, each of the layers remaining at the processing stage of FIG. 2 can be considered to be a patterned mask remaining over the upwardly-extending mesas 32 and 34 of the substrate. Also, any combination or sub-combination of the layers remaining over the mesas 32 and 34 at the processing stage of FIG. 2 can be considered to be a patterned mask. In particular aspects in which nitride-containing layer 16 remains over the mesas 32 and 34, the patterned structures over such layers can be referred to as a nitride-containing mask. For instance, the combination of layers 14 and 16 can be considered to be a nitride-containing mask.

The stacks of layers 14, 16 and 18 under segments 22 and 24 contain substantially vertical sidewalls 31 and 33, respectively; and such sidewalls are coextensive with substantially vertical sidewalls 35 and 37, respectively, of mesas 32 and 34.

Figure 3:
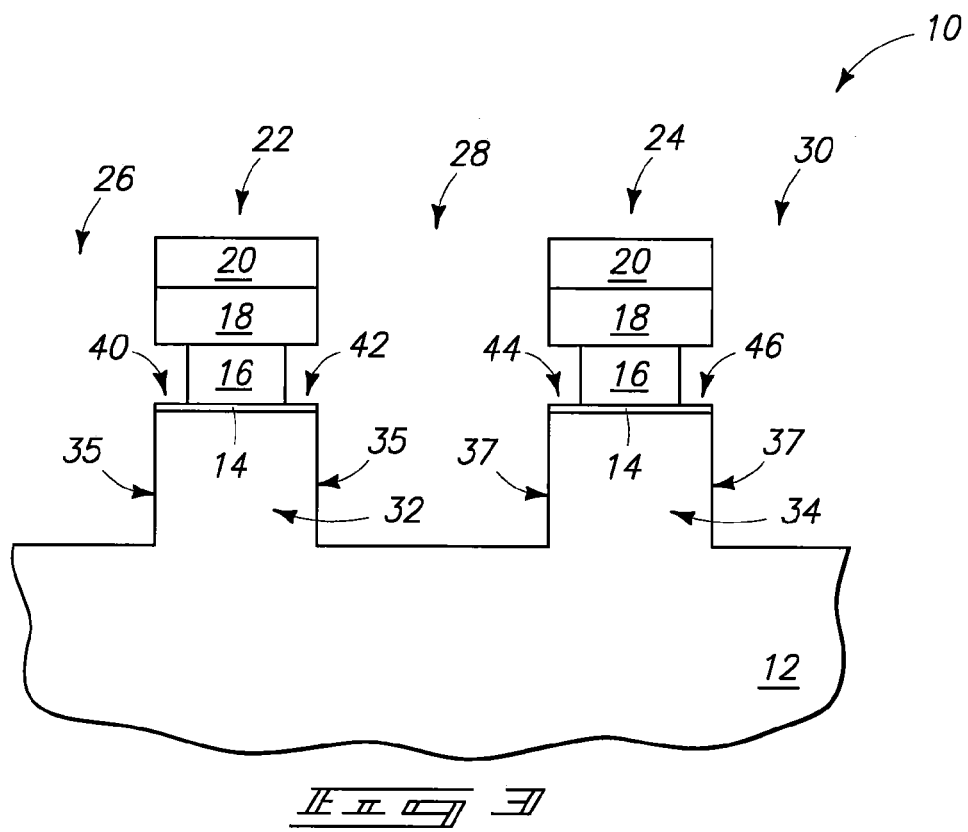
FIG. 3 is a view of the FIG. 1 fragment shown at a processing stage subsequent to that of FIG. 2.

Referring to FIG. 3, nitride-containing material of layer 16 is laterally recessed to reduce the lateral widths of the nitride-containing structures (or segments) comprised of the layer 16. Layer 16 can be laterally recessed by, for example, from about 50 Å to about 200 Å per side, and will typically be laterally recessed by about 100 Å per side.

The lateral recessing can be accomplished with any suitable etch of the nitride-containing material, and preferably with an etch which is selective for the nitride-containing material of layer 16 relative to other exposed materials of construction 10. In other words, the layer 16 is preferably removed with an etch which removes the nitride-containing material of layer 16 faster than other exposed materials of substrate 10, which can include, but which is not limited to, etches which are 100% selective for layer 16 relative to other exposed materials of construction 10.

The etch can be an isotropic dry etch in some exemplary aspects, and in other exemplary aspects can be a wet nitride strip. For instance, the etch can be a dry nitride strip using $H_2$, $N_2$, $CF_4$ and $O_2$. In a particular aspect, the etch can use a flow of the following: $N_2$ with 3.8% $H_2$ at 700 standard cubic centimeters per minute (sccm) to 1600 sccm; $CF_4$ at 30 sccm to 200 sccm; and $O_2$ at 40 sccm to 1000 sccm. A pressure during such etch can be from about 0.5 torr to about 2.5 torr; a temperature can be from about 20° C. to about 120° C.; and a microwave power can be from about 500 watts to about 3000 watts. Other gases can be used in addition to, or alternatively to, one or more of the $H_2$, $N_2$, $CF_4$ and $O_2$. Such other gases can comprise, for example, $N_2O$ and $H_2$; $H_2O$ and $N_2$; $CHF_3$; and $NF_3$.

As another example, the etch can be a wet nitride strip utilizing hot phosphoric acid for a time of from about 90 seconds to about 480 seconds (with the hot phosphoric acid stripping the nitride at a rate of about 44 Å per minute, and accordingly removing from about 60 Å to about 350 Å of the exposed nitride-containing material of layer 16).

In the shown aspect of the invention, photoresist 20 remains over construction 10 during the nitride strip. The photoresist can protect regions associated with the semiconductor wafer 12 which are peripheral to the fragment 10 of FIG. 3, and which can have damage induced therein by the conditions utilized for the nitride strip. The invention can also, however, include aspects in which the photoresist 20 is removed prior to the nitride strip. Regardless, the materials over nitride-containing layer 16 protect an upper surface of such layer during the isotropic conditions utilized for laterally recessing sidewalls of the layer.

The lateral recessing of the sidewalls of layer 16 exposes portions 40, 42, 44 and 46 of oxide-containing layer 14. The portion 40 is over mesa 32, and between trench 26 and a laterally-recessed sidewall of layer 16; the portion 42 is over mesa 32 and between trench 28 and a laterally-recessed sidewall of layer 16; the portion 44 is over a mesa 34 and between trench 28 and a laterally-recessed sidewall of layer 16; and the portion 46 is over mesa 34 and between trench 30 and a laterally-recessed portion of layer 16.

Figure 4:
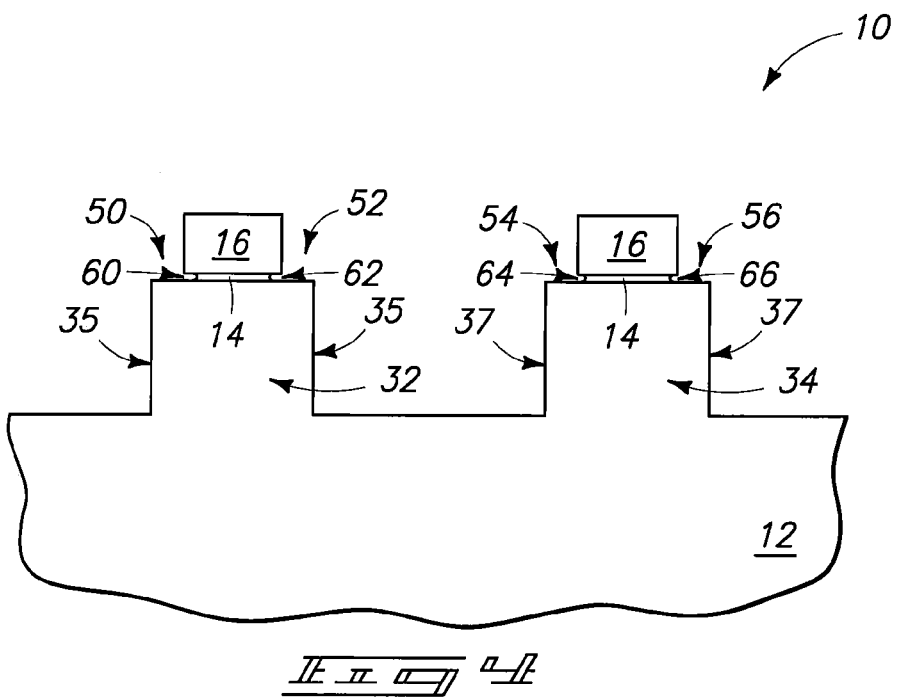
FIG. 4 is a view of the FIG. 1 fragment shown at a processing stage subsequent to that of FIG. 3.

Referring to FIG. 4, portions 40, 42, 44 and 46 (FIG. 3) of oxide-containing layer 14 are removed to expose regions 50, 52, 54 and 56, respectively of the semiconductor material of substrate 12 of mesas 32 and 34. As discussed previously, such semiconductor material can, in particular aspects, comprise, consist essentially of, or consist of silicon.

The shown removal of portions of oxide-containing layer 14 has extended to under nitride-containing material 16 to form recesses 60, 62, 64 and 66.

The removal of exposed portions of oxide-containing layer 14 can be accomplished with any suitable etch, and in particular aspects is accomplished with a buffered oxide etch such as, for example, an etch using a ratio of about 20:1 of $H_2O$:HF, under room temperature conditions.

In the shown aspect of the invention, layers 18 and 20 are removed from over layer 16 prior to the processing stage of FIG. 4. Such removal can occur before, during or after the oxide etch utilized to remove exposed portions of oxide-containing layer 14. For instance, photoresist 20 can first be removed, and then layers 18 and 14 can both be exposed to the oxide etch utilized to remove exposed portions of layer 14. Such etch can remove an entirety of oxide-containing layer 18, provided that the etching conditions are conducted for a suitable period of time to remove the thickness of layer 18.

In some aspects of the invention, layers 14 and 16 are together considered to be a nitride-containing mask. In such aspects, lateral recessing of the mask can be considered to comprise both of the recessing of the nitride-containing layer 16 discussed with reference to FIG. 3, and the removal of oxide-containing layer 14 discussed with reference to FIG. 4. Specifically, the lateral recessing of the mask 14/16 can be considered to comprise a first step which laterally recesses layer 16, and a subsequent step which laterally recesses oxide-containing layer 14.

Referring to FIG. 5, construction 10 is exposed to oxidizing conditions which form an oxide-containing material 70 extending within trenches 26, 28 and 30, and in the shown aspect of the invention also forms oxide-containing material 70 to extend along exposed surfaces of nitride-containing layer 16.

The oxidizing utilized to form material 70 consumes semiconductor material of substrate 12. A dashed line 71 is provided to show the location of the surface of substrate 12 prior to the oxidation (with the dashed line 71 corresponding to the location of the substrate at the processing stage of FIG. 4).

In particular aspects, substrate 12 will comprise, consist essentially of, or consist of silicon; and accordingly oxide-containing material 70 will comprise, consist essentially of, or consist of silicon dioxide in locations where the oxide is formed by consuming portions of the substrate 12. The material 70 is thus shown to merge with the oxide-containing layer 14, which, as discussed above, can also comprise, consist essentially of, or consist of silicon dioxide. The material 70 will have a different composition where the material is formed by oxidation of a surface of nitride-containing layer 16. For instance, the material 70 can comprise, consist essentially of, or consist of silicon oxynitride in locations where the material 70 is formed by oxidation of surfaces of nitride-containing layer 16.

The conditions utilized to form material 70 can be wet thermal oxidation. The oxidation preferably utilizes oxidant in the presence of hydrogen, and can, for example, comprise in situ steam generation (ISSG). In particular aspects, the oxidation utilizes steam in the presence of $H_2$, with the $H_2$ being present in the steam to a concentration of from about 2% to about 40%, by volume. In an exemplary application, the steam/$H_2$ mixture will comprise 33% $H_2$, by volume, and will be utilized at a temperature of 1050° C. and a pressure of 12 torr to form oxide-containing material 70 to have a thickness of from about 80 Å to about 280 Å along the silicon-containing surfaces of substrate 12. A typical thickness of the material 70 along the silicon-containing surfaces is about 180 Å.

Although the hydrogen is described as being provided as $H_2$, it is to be understood that the steam itself can also be a source of hydrogen, and accordingly in some cases the hydrogen present in the oxidant can be hydrogen of the $H_2O$ of the steam.

An advantage of utilizing hydrogen with the oxidant when forming material 70 is that the material can have different chemical and/or physical properties than other similar materials formed with different methods. For instance, if material 70 consists essentially of, or consists of silicon dioxide, the material can have different properties than material 14—even if material 14 also consists essentially of, or consists of silicon dioxide—due to material 70 being formed with different oxidizing conditions than those utilized to form material 14. The differences between the materials 14 and 70 can be, for example, differences in densities of the materials. The differences between materials 14 and 70 can enable material 14 to be removed somewhat selectively relative to material 70.

The upwardly-projecting portions, or mesas, 32 and 34 of FIG. 5 can be considered to be regions of semiconductor material 12 between trenches 26, 28 and 30. The region 32 can be considered to comprise an opposing pair of lateral edge portions 80 and 82 which are separated from one another by a central portion 84 between them. A pair of dashed lines 81 and 83 are provided to diagrammatically illustrate approximate boundaries between the lateral edge portion 80 and the central portion 84, and between the central portion 84 and the lateral edge portion 82. Region 34 similarly can be considered to comprise a pair of opposing lateral edge portions 90 and 92 separated from one another by a central portion 94; with dashed lines 91 and 93 being provided to diagrammatically illustrate boundaries between the lateral edge portions and the central portion.

The material 16 can, in some aspects, be considered to be a first material in the construction of FIG. 5, and the segments of material 16 over regions 32 and 34 can thus be considered to be first material segments 100 and 102. The segments 100 and 102 have lateral edges 103 and 105, respectively. Also, regions 32 and 34 have lateral edges 107 and 109, respectively. The lateral edges 103 of segment 100 are laterally inset relative to the edges 107 of the underlying upwardly-extending region 32 of the semiconductor material, and similarly the lateral edges 105 are laterally inset relative to the lateral edges 109 of upwardly-projecting region 34 of the semiconductor material.

The oxide material 70 forms a pair of oxide structures 110 and 112 over projection 32 and specifically across the lateral edge portions 80 and 82 of such projection. Similarly, the oxide material 70 forms a pair of oxide structures 114 and 116 across projection 34, and specifically across the lateral edge portions 90 and 92 of such projection.

FIG. 12 shows an expanded region of the FIG. 5 structure, and illustrates that oxide-containing structure 110 comprises a bottom surface 121, and similarly oxide-containing structure 112 comprises a bottom surface 123. The oxide-containing structures 110 and 112 also contain top surfaces 141 and 143, respectively. In particular aspects, the oxide-containing material 70 consists essentially of, or consists of silicon dioxide along projection 32, and then changes composition to consist essentially of, or consist of silicon oxynitride along nitride-containing material 16. In such aspects, the upper surfaces 141 and 143 comprise regions along projection 32 which consist essentially of, or consist of silicon dioxide; and also comprise regions along material 16 which consist essentially of, or consist of silicon oxynitride.

The top surfaces have topographies which are substantially horizontal. In contrast, the bottom surfaces have topographies which include steps. Specifically, the surface 121 has a topography which includes a step 125, and the surface 123 has a topography which includes a step 127. The steps extend upwardly from substantially horizontal portions 129 and 131 of the bottom surfaces. In particular aspects, the steps can extend approximately perpendicularly to the substantially horizontal portions of the bottom surfaces (i.e., can be within about 10 degrees of perpendicular to the bottom surfaces), and in other aspects the steps can extend in directions which are not approximately perpendicular to the substantially horizontal portions of the bottom surfaces. For instance, the steps can extend at approximately a 45 degree angle to the horizontal portions in some aspects of the invention.

The step 125 extends across an elevational distance between the horizontal surface portion 129 and a substantially horizontal upper surface 133 of the mesa 32. Such elevational distance is typically from at least about 50 Å to less than or equal to about 150 Å. The step 127, similarly to the step 125, extends across the elevational distance between the horizontal surface portion 131 and the upper surface 133 of the mesa 32.

The steps 125 and 127 can be in the form of single steps (as shown), or can comprise multiple small steps which together span the elevational distance from the substantially horizontal bottom surfaces 129 and 131 to the surface 133 atop projection 32.

In the shown aspect of the invention, a portion of the oxide-containing layer 14 remains under the segment of material 16, and the oxide 70 merges with the oxide-containing layer 14. The steps 125 and 127 occur at approximate locations where the merger of material 70 and material 14 occurs. Thus, the length of layer 14 at the processing stage of FIG. 4 dictates the distance between the steps 125 and 127. Steps 125 and 127 can occur at any suitable location relative to outer lateral surfaces 107 of projection 32. The steps are approximately shown distances 150 and 152 from surfaces 107. In particular aspects, such distances can be from at least about 100 Å to less than or equal to about 300 Å. In some aspects, the distances 150 and 152 can be at least about 100 Å. Also, although distances 150 and 152 are shown to be about the same as one another, it is to be understood that the invention can also encompass aspects in which distances 150 and 152 are different from one another.

Referring to FIG. 6, electrically insulative material 160 is deposited within trenches 26, 28 and 30, and over oxide structures 110, 112, 114 and 116. The insulative material 160 is ultimately incorporated into trenched isolation structures in typical aspects of the invention. Accordingly, the material 160 can comprise any material suitable for incorporation into trenched isolation structures, including, for example, silicon dioxide formed utilizing a high density plasma (so-called HDP oxide).

A substantially planar uppermost surface 161 is shown extending across material 160 and segments 100 and 102 of material 16. Such substantially planar surface can be formed by, for example, chemical-mechanical polishing after deposition of insulative material 160.

Figure 7:
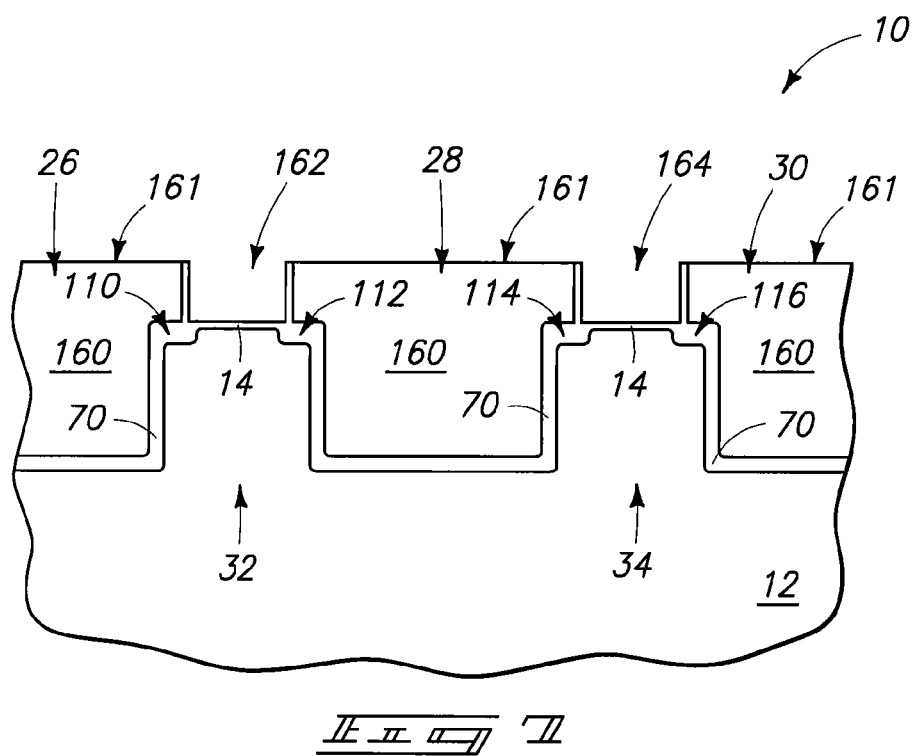
FIG. 7 is a view of the FIG. 1 fragment shown at a processing stage subsequent to that of FIG. 6.

Referring to FIG. 7, nitride-containing layer 16 is removed utilizing an appropriate etch. Such etch can comprise, for example, an isotropic dry etch, or a wet nitride etch, such as, for example, one of the etches discussed above for laterally recessing the material 16 at the processing stage of FIG. 3. The removal of material 16 forms openings 162 and 164 which expose portions of oxide-containing structures 110, 112, 114 and 116; and which also exposes remaining portions of oxide-containing layer 14.

Figure 8:
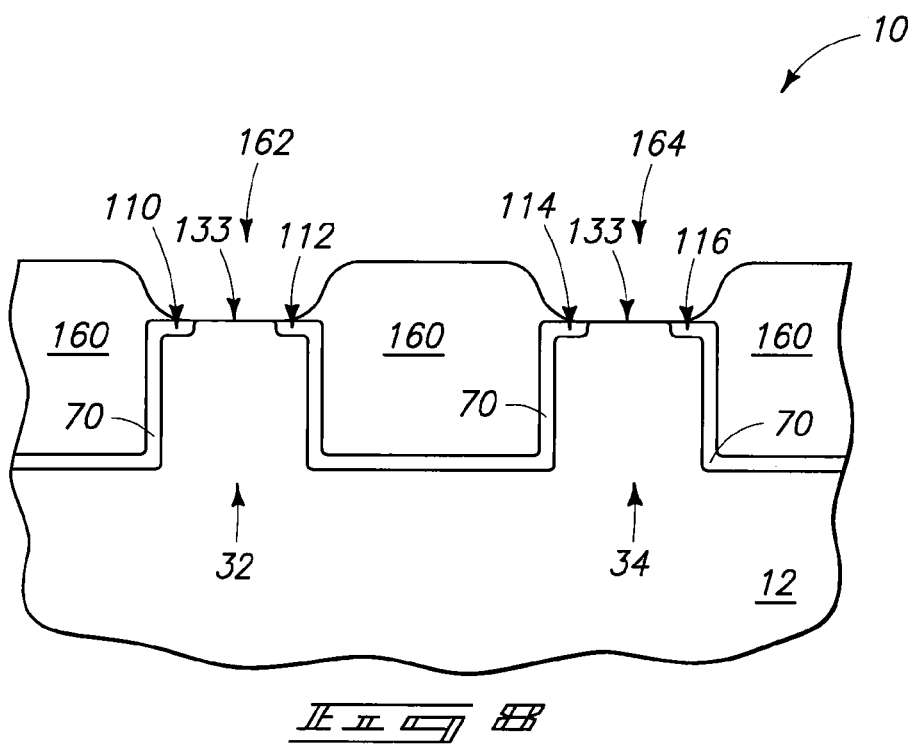
FIG. 8 is a view of the FIG. 1 fragment shown at a processing stage subsequent to that of FIG. 7.

Referring to FIG. 8, an oxide etch is utilized to remove oxide 14 from over upper surfaces 133 of upwardly-projecting regions 32 and 34. The etch selectively removes oxide-containing material 14 relative to the oxide material 70. Such selectivity can occur even though materials 14 and 70 have the same composition as one another. Numerous possible mechanisms exist for how oxide material 14 can be selectively removed relative to oxide 70. Some of the mechanisms will be specifically described herein. Such mechanisms are provided to assist the reader in understanding the invention. The invention is not, however, to be limited to such mechanisms except to the extent, if any, that such mechanisms are expressly recited in the claims that follow.

Exemplary mechanisms by which etch selectivity for an oxide material 14 relative to an oxide material 70 having the same composition as material 14 can occur are if the materials have different physical properties relative to one another, such as differences in density, for example; and/or if geometric constraints make it more difficult to remove oxide material 70 than oxide material 14 (for instance, surface tension effects may render it difficult for an oxide etch to attack recessed corners associated with oxide 70).

In particular aspects of the invention, oxide 14 will consist of silicon dioxide formed by thermal oxidation of silicon-containing material of substrate 12 in the absence of hydrogen, and oxide 70 will consist of silicon dioxide formed by oxidation of silicon-containing material substrate 12 in the presence of hydrogen. Such difference in methodologies for formation of oxide 70 relative to oxide 14 can lead to physical differences between the silicon dioxide of material 70 relative to the silicon dioxide of material 14 so that material 14 can be selectively removed relative to material 70. The "selective removal" of oxide 14 means that oxide 14 is removed faster than oxide 70, which can include, but is not limited to, aspects in which the selectivity is 100% for oxide 14 relative to the oxide 70. It is noted, however that some of oxide 70 is removed by the etch of oxide 14. Specifically the projections of oxide 70 that had been along nitride layer 16, and hence comprised silicon oxynitride rather than silicon dioxide, are present at the processing stage of FIG. 7, and removed by the etch utilized to form the construction of FIG. 8.

The selective removal of oxide 14 can be accomplished with, for example, a buffered oxide etch of the type described previously for recessing the oxide 14 to form the structure of FIG. 4.

In the shown aspect of the invention, the removal of oxide 14 is accompanied by dishing into material 160 to widen openings 162, and accordingly the openings 162 are wider at the processing stage of FIG. 8 than at the processing stage of FIG. 7.

Figure 9:
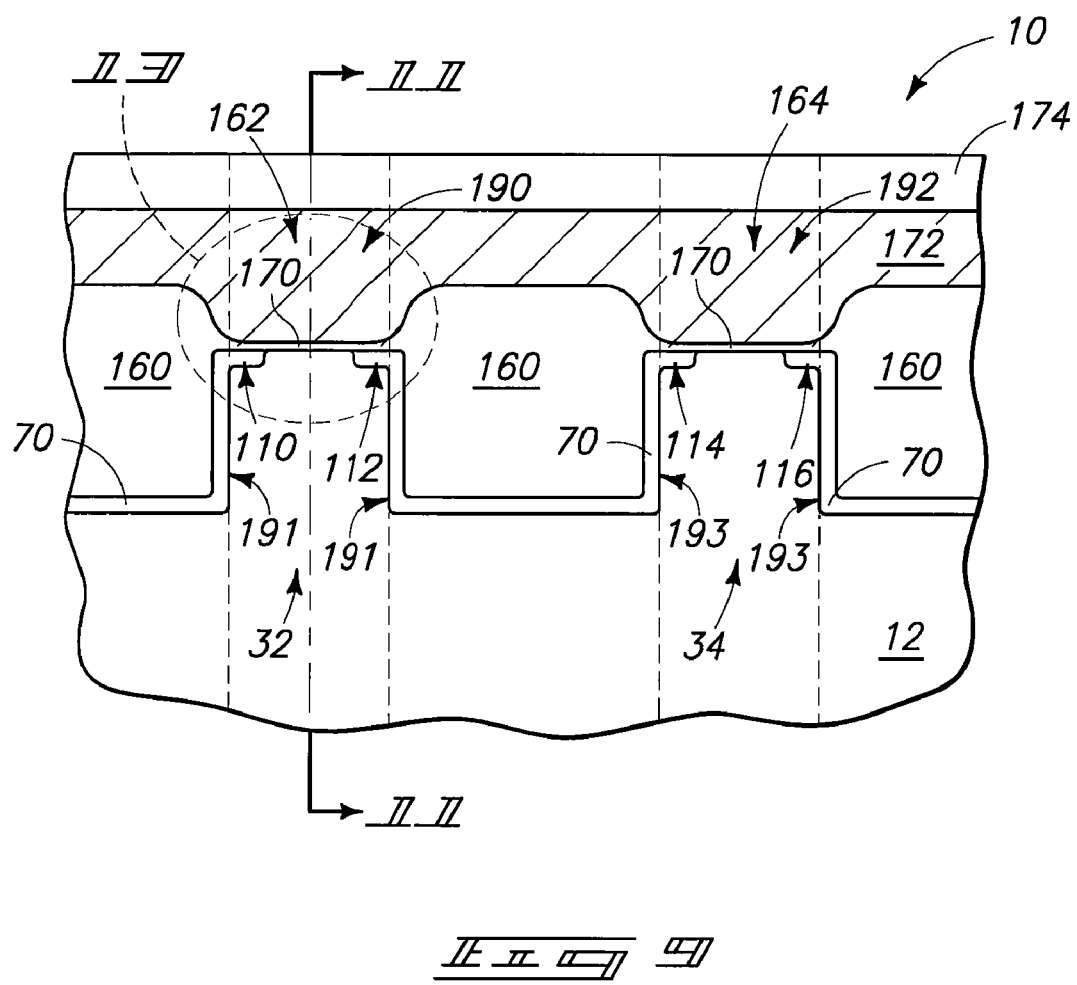
FIG. 9 is a view of the FIG. 1 fragment shown at a processing stage subsequent to that of FIG. 8.

Referring to FIG. 9, gate dielectric material 170 is provided atop semiconductor material projections 32 and 34. The gate dielectric material can, for example, comprise, consist essentially of, or consist of silicon dioxide. Such can be formed by, for example, thermal oxidation of the semiconductor material of projections 32 and 34.

Electrically conductive gate material 172 is provided over the gate dielectric 170 as a line extending across both of regions 32 and 34, and within openings 162 and 164. The electrically conductive gate material can comprise any suitable composition or combination of compositions, and in particular aspects will comprise, consist essentially of, or consist of one or more of conductively-doped semiconductor material (such as, for example, conductively-doped silicon), metal (such as, for example, titanium or tungsten), and metal compounds (such as, for example, titanium silicide).

An electrically insulative protective material 174 is formed over line 172. Material 174 can comprise any suitable composition or combination of compositions, and in particular aspects will comprise one or more of silicon dioxide, silicon nitride and silicon oxynitride.

The line 172 can be a wordline utilized to form transistor constructions of a memory array, as described with reference to FIGS. 10 and 11.

FIG. 10 shows a top view of a portion of a wafer comprising the fragment of FIG. 9, and shows that the isolation regions 160 can extend along opposing sides of the line shown in FIG. 9. FIG. 10 also shows that source/drain regions 180 and 182 can extend in and out of the page relative to the projection 32 of the cross-section of FIG. 9; and similarly source/drain regions 184 and 186 can extend in and out of the page relative to the projection 34 of the cross-sectional view of FIG. 9. Each of the regions where the line 174 crosses between paired source/drain regions can be considered to correspond to a transistor device, with one of the transistor devices of FIG. 10 being labeled as 190, and the other being labeled as 192. Such transistor devices have field edges 191 and 193, respectively. The field edges are also shown in FIG. 9, and correspond approximately to the outermost lateral edges of projections 34 and 36.

The cross-section of FIG. 11 shows transistor device 190, and specifically shows that the dielectric material 170, conductive gate material 172 and protective insulative material 174 can be together incorporated into a transistor gate stack. The gate stack contains a transistor gate which couples source/drain regions 182 and 180 with one another. The region of substrate 12 under dielectric material 170 can be doped with a threshold voltage ($V_T$) implant, as such region is a channel region between the source/drain regions.

A pair of sidewall spacers 194 are shown along sidewall edges of the gate stack, as would be a typical construction. The sidewall spacers can comprise, for example, one or more of silicon dioxide, silicon nitride, and silicon oxynitride.

The transistor device 190 can be incorporated into any of numerous integrated circuit constructions. The source/drain region 180 is shown coupled to circuitry 200, and the source/drain region 182 is shown coupled to circuitry 202. The transistor device 190 can be utilized as a logic device if it is coupled to appropriate circuitry 200 and 202, or can be incorporated into a memory unit cell if it is coupled with other circuitry 200 and 202. For instance, the transistor device 190 can be incorporated into a dynamic random access memory (DRAM) unit cell if one of the circuit devices 200 or 202 is a charge-storage device (such as, for example, a capacitor), and the other is an electrical connection to a bitline. A plurality of such DRAM unit cells can be together incorporated into a memory array.

The formation of one or more of the gate stack layers 170, 172 and 174 of FIG. 9 within locations vacated by one or both of masking materials 14 and 16 can be considered replacement of at least a portion of a mask with at least a portion of a transistor gate stack.

FIG. 13 shows an expanded view of a region 13 of the FIG. 9 cross-section. FIG. 13 shows that semiconductor material region 34 comprises the opposing pair of lateral edge portions 80 and 82 described with reference to FIG. 12, and comprises the central portion 84 between the lateral edge portions. The construction of FIG. 13 also comprises the oxide structures 110 and 112 formed of oxide-containing material 70. Such structures contain the bottom surfaces 121 and 123 having the topography comprising substantially horizontal portions 129 and 131, and steps 125. Further, the oxide structures 110 and 112 have upper surfaces 250 and 252, respectively, which are directly over the bottom surfaces 121 and 123. Such upper surfaces 250 and 252 are substantially planar, and are much more planar than the bottom surfaces comprising the steps 125 and 127. In particular aspects, the upper surfaces will be planar to within 10 Å, and in some aspects will be planar to within 5 Å, in locations where the upper surfaces are extending directly over both the substantially horizontal portions (129 and 131) and step portions (125 and 127) of the bottom surfaces.

In some aspects, materials 70, 160 and 170 all consist essentially of or consist of silicon dioxide. In such aspects, the materials can be considered to merge to form a single oxide. The single oxide has uppermost surfaces 257 and 259 over bottom surfaces 121 and 123. The uppermost surfaces 257 and 259 are substantially planar, and are much more planar than the bottom surfaces comprising the steps 125 and 127. In particular aspects, the upper surfaces 257 and 259 will be planar to within 10 Å, and in some aspects will be planar to within 5 Å, in locations where such upper surfaces are extending directly over both the substantially horizontal portions (129 and 131) and step portions (125 and 127) of the bottom surfaces.

The construction of FIG. 13 advantageously has recessed corners 253 and 255 beneath the gate transistor device 190 adjacent the isolation oxide 160. Such recessed corners correspond to regions within the oxide structures 110 and 112 where the steps 125 and 127 join with the substantially horizontal portions 129 and 131. The recessed corners 253 and 255 can alleviate detrimental fringing electric fields of the type discussed in the "Background" section of this disclosure.

The construction of FIG. 13 can also avoid the problem of thinning of the field oxide that was discussed in the "Background" section of this disclosure. Regardless of whether there is a sharp corner on the lower surfaces 121 and 123, the thickness of the oxide between such lower surfaces and the gate material 172 can mitigate fringing-field-related issues that would otherwise be associated with the corners if the oxide were thinner at the corners.

In some aspects, the structure of FIG. 13 can be considered to have steps near the field edges of the semiconductor material of projection 32. Yet, the gate of transistor device 190 (specifically, the conductive material 172) does not follow the contour of the silicon substrate. Rather it follows a horizontal or nearly horizontal contour along an upper surfaces of the oxides 70 and 170. Such can be advantageous for maintaining desired uniformity across numerous transistor gates, and for maintaining desired properties of individual gates.

The invention can have numerous advantages relative to various methods that have been attempted in the prior art to alleviate fringing affects. Such advantages can include: (1) The invention can be simple to implement, (2) the invention can be inexpensive to implement, (3) the invention can be robust to process variation, and (4) the invention can provide a relatively large margin to thinning.

Devices formed in accordance with aspects of the present invention can be utilized in numerous electronic systems. FIGS. 14-17 describe exemplary electronic systems.

Figure 14:
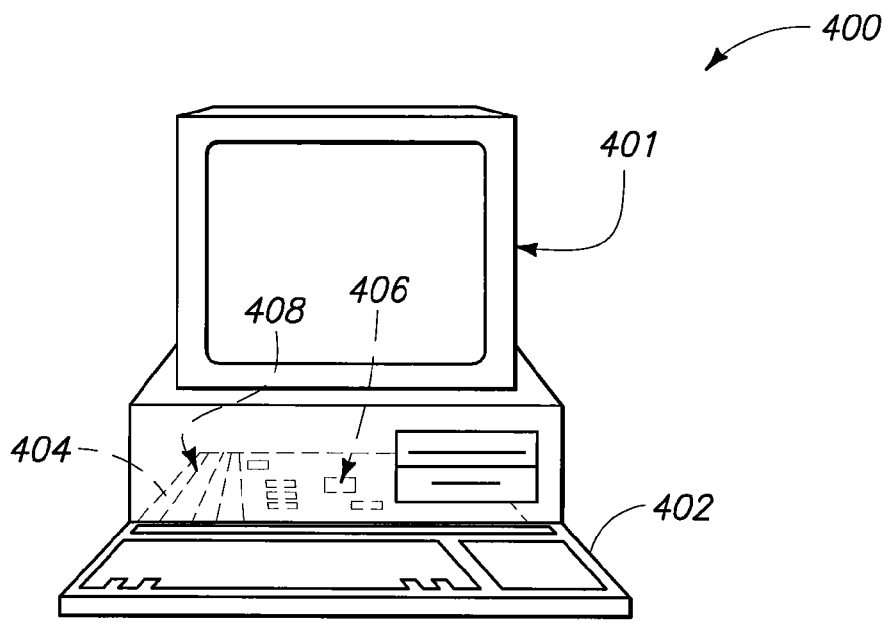
FIG. 14 is a diagrammatic view of a computer illustrating an exemplary application of the present invention.
Figure 15:
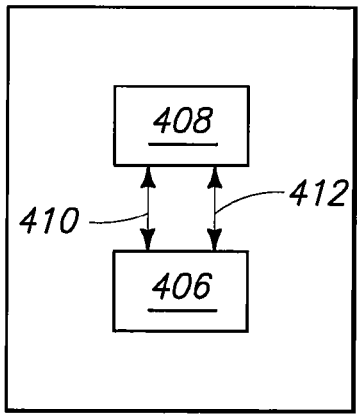
FIG. 15 is a block diagram showing particular features of the motherboard of the FIG. 14 computer.

FIG. 14 illustrates generally, by way of example but not by way of limitation, an embodiment of a computer system 400 according to an aspect of the present invention. Computer system 400 includes a monitor 401 or other communication output device, a keyboard 402 or other communication input device, and a motherboard 404. Motherboard 404 can carry a microprocessor 406 or other data processing unit, and at least one memory device 408. Memory device 408 can comprise various aspects of the invention described above. Memory device 408 can comprise an array of memory cells, and such array can be coupled with addressing circuitry for accessing individual memory cells in the array. Further, the memory cell array can be coupled to a read circuit for reading data from the memory cells. The addressing and read circuitry can be utilized for conveying information between memory device 408 and processor 406. Such is illustrated in the block diagram of the motherboard 404 shown in FIG. 15. In such block diagram, the addressing circuitry is illustrated as 410 and the read circuitry is illustrated as 412. Various components of computer system 400, including processor 406, can comprise one or more of the memory constructions described previously in this disclosure.

Processor device 406 can correspond to a processor module, and associated memory utilized with the module can comprise teachings of the present invention.

Memory device 408 can correspond to a memory module. For example, single in-line memory modules (SIMMs) and dual in-line memory modules (DIMMs) may be used in the implementation which utilize the teachings of the present invention. The memory device can be incorporated into any of a variety of designs which provide different methods of reading from and writing to memory cells of the device. One such method is the page mode operation. Page mode operations in a DRAM are defined by the method of accessing a row of a memory cell arrays and randomly accessing different columns of the array. Data stored at the row and column intersection can be read and output while that column is accessed.

An alternate type of device is the extended data output (EDO) memory which allows data stored at a memory array address to be available as output after the addressed column has been closed. This memory can increase some communication speeds by allowing shorter access signals without reducing the time in which memory output data is available on a memory bus. Other alternative types of devices include SDRAM, DDR SDRAM, SLDRAM, VRAM and Direct RDRAM, as well as others such as SRAM or Flash memories.

Memory device 408 can comprise memory formed in accordance with one or more aspects of the present invention.

FIG. 16 illustrates a simplified block diagram of a high-level organization of various embodiments of an exemplary electronic system 700 of the present invention. System 700 can correspond to, for example, a computer system, a process control system, or any other system that employs a processor and associated memory. Electronic system 700 has functional elements, including a processor or arithmetic/logic unit (ALU) 702, a control unit 704, a memory device unit 706 and an input/output (I/O) device 708. Generally, electronic system 700 will have a native set of instructions that specify operations to be performed on data by the processor 702 and other interactions between the processor 702, the memory device unit 706 and the I/O devices 708. The control unit 704 coordinates all operations of the processor 702, the memory device 706 and the I/O devices 708 by continuously cycling through a set of operations that cause instructions to be fetched from the memory device 706 and executed. In various embodiments, the memory device 706 includes, but is not limited to, random access memory (RAM) devices, read-only memory (ROM) devices, and peripheral devices such as a floppy disk drive and a compact disk CD-ROM drive. One of ordinary skill in the art will understand, upon reading and comprehending this disclosure, that any of the illustrated electrical components are capable of being fabricated to include memory constructions in accordance with various aspects of the present invention.

FIG. 17 is a simplified block diagram of a high-level organization of various embodiments of an exemplary electronic system 800. The system 800 includes a memory device 802 that has an array of memory cells 804, address decoder 806, row access circuitry 808, column access circuitry 810, read/write control circuitry 812 for controlling operations, and input/output circuitry 814. The memory device 802 further includes power circuitry 816, and sensors 820, such as current sensors for determining whether a memory cell is in a low-threshold conducting state or in a high-threshold non-conducting state. The illustrated power circuitry 816 includes power supply circuitry 880, circuitry 882 for providing a reference voltage, circuitry 884 for providing the first wordline with pulses, circuitry 886 for providing the second wordline with pulses, and circuitry 888 for providing the bitline with pulses. The system 800 also includes a processor 822, or memory controller for memory accessing.

The memory device 802 receives control signals from the processor 822 over wiring or metallization lines. The memory device 802 is used to store data which is accessed via I/O lines. It will be appreciated by those skilled in the art that additional circuitry and control signals can be provided, and that the memory device 802 has been simplified to help focus on the invention. At least one of the processor 822 or memory device 802 can include a memory construction of the type described previously in this disclosure.

The various illustrated systems of this disclosure are intended to provide a general understanding of various applications for the circuitry and structures of the present invention, and are not intended to serve as a complete description of all the elements and features of an electronic system using memory cells in accordance with aspects of the present invention. One of the ordinary skill in the art will understand that the various electronic systems can be fabricated in single-package processing units, or even on a single semiconductor chip, in order to reduce the communication time between the processor and the memory device(s).

Applications for memory cells can include electronic systems for use in memory modules, device drivers, power modules, communication modems, processor modules, and application-specific modules, and may include multilayer, multichip modules. Such circuitry can further be a subcomponent of a variety of electronic systems, such as a clock, a television, a cell phone, a personal computer, an automobile, an industrial control system, an aircraft, and others.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A semiconductor construction, comprising:
   a region of semiconductor material having a central portion between a pair of lateral edge portions;
   an electrically conductive line over the region of the semiconductor material;
   a dielectric material between the electrically conductive line and the region of the semiconductor material; the dielectric material having a bottom surface with a topography that includes a step of at least about 50 Å, and an upper surface directly over the bottom surface and having a topography that is substantially planar; and
   wherein the line has a thick segment over the region of the semiconductor material and a thin segment adjacent the thick segment.

2. The construction of claim 1 wherein said step is from at least about 50 Å to less than or equal to about 150 Å.

3. The construction of claim 1 wherein the bottom surface comprises a substantially horizontal portion adjacent the step, and wherein the step is approximately perpendicular to said substantially horizontal portion.

4. The construction of claim 1 wherein the bottom surface comprises a substantially horizontal portion adjacent the step, and wherein the step is not approximately perpendicular to said substantially horizontal portion.

5. The construction of claim 1 wherein the dielectric material consists of silicon dioxide.

6. A semiconductor construction, comprising:
   a semiconductor substrate having trenches extending into monocrystalline silicon, and having pedestals of the monocrystalline silicon between the trenches; individual pedestals having opposing pairs of lateral edge portions along the trenches and central portions between the opposing pairs of lateral edge portions;
   an electrically conductive structure extending across two or more of the pedestals; and
   a dielectric material between the electrically conductive structure and the pedestals; the dielectric material including oxide over the lateral edge portions of the pedestals, the oxide having a bottom surface with a topography that includes a step of at least about 50 Å, and an upper surface directly over the bottom surface and having a topography that is substantially planar.

7. The construction of claim 6 further comprising electrically insulative isolation structures within the trenches and between the pedestals, and wherein the electrically conductive structure extends across two or more of the isolation structures.

8. The construction of claim 6 wherein the oxide consists of silicon dioxide.

9. A semiconductor construction, comprising:
   a monocrystalline silicon substrate having trenches extending therein; regions of the monocrystalline silicon being between the trenches; individual regions of the monocrystalline silicon having opposing pairs of lateral edge portions along the trenches and central portions between the opposing pairs of lateral edge portions;
   an electrically conductive line extending across two or more of the regions of the monocrystalline silicon;
   a dielectric material between the electrically conductive line and the regions of the monocrystalline silicon; the dielectric material including oxide over the lateral edge portions of the regions, the oxide having a bottom surface with a topography that includes a step of at least about 50 Å, and an upper surface directly over the bottom surface and having a topography that is substantially planar; and
   wherein the line has thick segments over the regions of the monocrystalline silicon and thin segments between the thick segments.

* * * * *